United States Patent
Lu

(10) Patent No.: US 10,186,531 B2
(45) Date of Patent: Jan. 22, 2019

(54) THIN FILM TRANSISTOR ARRAY SUBSTRATE AND METHOD OF MANUFACTURING THEREOF

(71) Applicant: Shenzhen China Star Optoelectronics Technology Co., Ltd., Shenzhen, Guangdong (CN)

(72) Inventor: Macai Lu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 211 days.

(21) Appl. No.: 15/300,247

(22) PCT Filed: Jul. 21, 2016

(86) PCT No.: PCT/CN2016/090845
§ 371 (c)(1),
(2) Date: Sep. 28, 2016

(87) PCT Pub. No.: WO2018/006446
PCT Pub. Date: Jan. 11, 2018

(65) Prior Publication Data
US 2018/0175079 A1    Jun. 21, 2018

(30) Foreign Application Priority Data
Jul. 5, 2016 (CN) .......................... 2016 1 0523648

(51) Int. Cl.
*H01L 27/12* (2006.01)
*H01L 21/02* (2006.01)
(Continued)

(52) U.S. Cl.
CPC ...... *H01L 27/1288* (2013.01); *H01L 21/0274* (2013.01); *H01L 21/02271* (2013.01);
(Continued)

(58) Field of Classification Search
CPC .................................................... H01L 27/12
See application file for complete search history.

(56) References Cited

FOREIGN PATENT DOCUMENTS

CN    103123911 A  *  5/2013
CN    103151304 A  *  6/2013
(Continued)

*Primary Examiner* — Marvin Payen
(74) *Attorney, Agent, or Firm* — Andrew C. Cheng

(57) ABSTRACT

The present application discloses a method for manufacturing a thin film transistor, including: subsequently depositing a first passivation layer, an organic insulating layer, and a second passivation layer on a gate insulating layer of the substrate, an active layer, a source electrode and a drain electrode; applying a photoresist layer on the second passivation layer, and performing a pattern process to define a pixel electrode layer pattern, a common electrode layer pattern, and a cured layer pattern; defining the pixel electrode layer pattern, the common electrode layer pattern, and the cured layer pattern by the etching process on the second passivation layer, the organic insulating layer, the first passivation layer and partial of the gate insulating layer, ashing the photoresist layer; and forming a pixel electrode layer on the organic insulating layer, forming a common electrode layer on the organic insulating layer exposed by the second passivation layer.

8 Claims, 4 Drawing Sheets

(51) Int. Cl.
    *H01L 21/027*     (2006.01)
    *H01L 21/4757*     (2006.01)
    *H01L 29/66*     (2006.01)
    *H01L 29/786*     (2006.01)
    *H01L 29/49*     (2006.01)

(52) U.S. Cl.
    CPC ........ *H01L 21/47573* (2013.01); *H01L 27/12* (2013.01); *H01L 27/124* (2013.01); *H01L 27/1225* (2013.01); *H01L 27/1248* (2013.01); *H01L 27/1262* (2013.01); *H01L 29/66969* (2013.01); *H01L 29/7869* (2013.01); *H01L 29/4908* (2013.01)

(56) References Cited

FOREIGN PATENT DOCUMENTS

| CN | 105140178 A | * | 12/2015 | ........... G02F 1/1368 |
|---|---|---|---|---|
| CN | 105336626 A | * | 2/2016 | |

* cited by examiner

THIN FILM TRANSISTOR ARRAY SUBSTRATE AND METHOD OF MANUFACTURING THEREOF

CROSS REFERENCE

This application claims the priority of Chinese Patent Application No. 201610523648.6, entitled "THIN FILM TRANSISTOR ARRAY SUBSTRATE AND METHOD OF MANUFACTURING THEREOF", filed on Jul. 5, 2016, the disclosure of which is incorporated herein by reference in its entirety.

FIELD OF THE INVENTION

The present application relates to a manufacturing field of thin film transistor, and more particularly to a thin film transistor array substrate and method of manufacturing thereof.

BACKGROUND OF THE INVENTION

The Fringe Field Switching, FFS type of thin film transistor of the conventional technology has a large viewing angle and transmittance are widely used now, it usually takes 6-8 times of mask (exposure) in the process of producing the thin film transistor array substrate to form a gate line and a gate electrode, an active layer, an etching stop layer, a source electrode and a drain electrode, a passivation layer, an electrode and vias etc. respectively, the production process is complicated, the manufacturing cost increases accordingly.

SUMMARY OF THE INVENTION

The present application provides a thin film transistor array substrate and method of manufacturing thereof to decrease the time for exposure, simplify the manufacturing process, and decreasing the cost.

The method for manufacturing a thin film transistor in the present application, including:

forming a gate electrode and a gate line on the substrate, and a gate insulating layer covering the gate electrode, the gate line, and the substrate;

forming an active layer, a source electrode and a drain electrode on the gate insulating layer;

depositing a first passivation layer on the gate insulating layer of the substrate, the active layer, the source electrode and the drain electrode;

forming an organic insulating layer on the first passivation layer, partial of the first passivation layer is exposed by the organic insulating layer;

depositing a second passivation layer on the organic insulating layer and the first passivation layer;

applying a photoresist layer on the second passivation layer, and performing a pattern process to the photoresist layer to define a pixel electrode layer pattern, a common electrode layer pattern, and a cured layer pattern opposite to the active layer;

defining the pixel electrode layer pattern, the common electrode layer pattern, and the cured layer pattern according to the pixel electrode layer pattern, the common electrode layer pattern, and the cured layer pattern on the photoresist layer by the etching process on the second passivation layer, the organic insulating layer, the first passivation layer and partial of the gate insulating layer, wherein the organic insulating layer has a region to expose the second passivation layer, the opposite sides of each pattern region of the second passivation layer is projecting to the two sides of the covered organic insulating layer;

ashing the photoresist layer; and depositing a conductive layer material on the defined second passivation layer and the region of the organic insulating layer exposed by the second passivation layer, the conductive layer material forms a pixel electrode layer on the second passivation layer, and forms a common electrode layer on the organic insulating layer exposed by the second passivation layer.

Wherein the step of forming an organic insulating layer on the first passivation layer further including:

forming a first through hole and a second through hole on the organic insulating layer, the first through hole and the second through hole exposed partial of the organic insulating layer, the first through hole is for connecting to the drain electrode and the common electrode is formed inside the first through hole, the second through hole is for communication with the gate line.

Wherein the step of defining the pixel electrode layer pattern, the common electrode layer pattern, and the cured layer pattern according to the pixel electrode layer pattern, the common electrode layer pattern, and the cured layer pattern on the photoresist layer by the etching process on the second passivation layer, the organic insulating layer, the first passivation layer and partial of the gate insulating layer including using a first dry etching gas to etch the second passivation layer, the organic insulating layer, the first passivation layer and partial of the gate insulating layer, and adding a second dry etching gas and etching the region of the organic insulating layer exposed by the second passivation layer.

Wherein the second etching gas and the first and the etching gas are the same or are oxygen.

Wherein the step of defining the pixel electrode layer pattern, the common electrode layer pattern, and the cured layer pattern according to the pixel electrode layer pattern, the common electrode layer pattern, and the cured layer pattern on the photoresist layer by the etching process on the second passivation layer, the organic insulating layer, the first passivation layer and partial of the gate insulating layer including using oxygen to supplementary etching the organic insulating layer.

Wherein the first passivation layer and the second passivation layer are formed by chemical vapor deposition.

Wherein a gap is formed between each electrode of the pixel electrode layer and the both sides of the organic insulating layer covered by the second passivation layer.

Wherein the material of the first passivation layer and the second passivation layer are SiNx or SiO.

The present application further includes a thin film transistor array substrate, wherein the thin film transistor at least including a substrate, a gate electrode and a gate line formed on the substrate, a gate insulating layer covering the gate electrode, the gate line, and the substrate;

an active layer, a source electrode and a drain electrode formed on the gate insulating layer;

a first passivation layer formed on the gate insulating layer of the substrate, the active layer, the source electrode and the drain electrode;

an organic insulation layer and a second passivation layer formed on the first passivation layer, the organic insulating layer including a region to exposed by the second passivation layer;

a pixel electrode layer formed on the second passivation layer, and a common electrode layer formed on the organic insulating layer exposed by the second passivation layer; and Wherein, the opposite sides of each pattern region of the second passivation layer is projecting to the two sides of the covered organic insulating layer.

Wherein a gap is formed between each electrode of the pixel electrode layer and the both sides of the organic insulating layer covered by the second passivation layer.

The pixel electrode layer and the common electrode layer formed by the method of manufacturing the thin film transistor of the present application are formed by deposition, the second passivation layer and the organic insulating layer to form the pixel electrode layer and the common electrode layer are formed by a single etching, so that the entire manufacturing of the thin film transistor save at least one pattern process comparing to the conventional technology, simply the manufacturing processes step of the thin film transistor, and the production costs of the thin film transistor is decreased.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
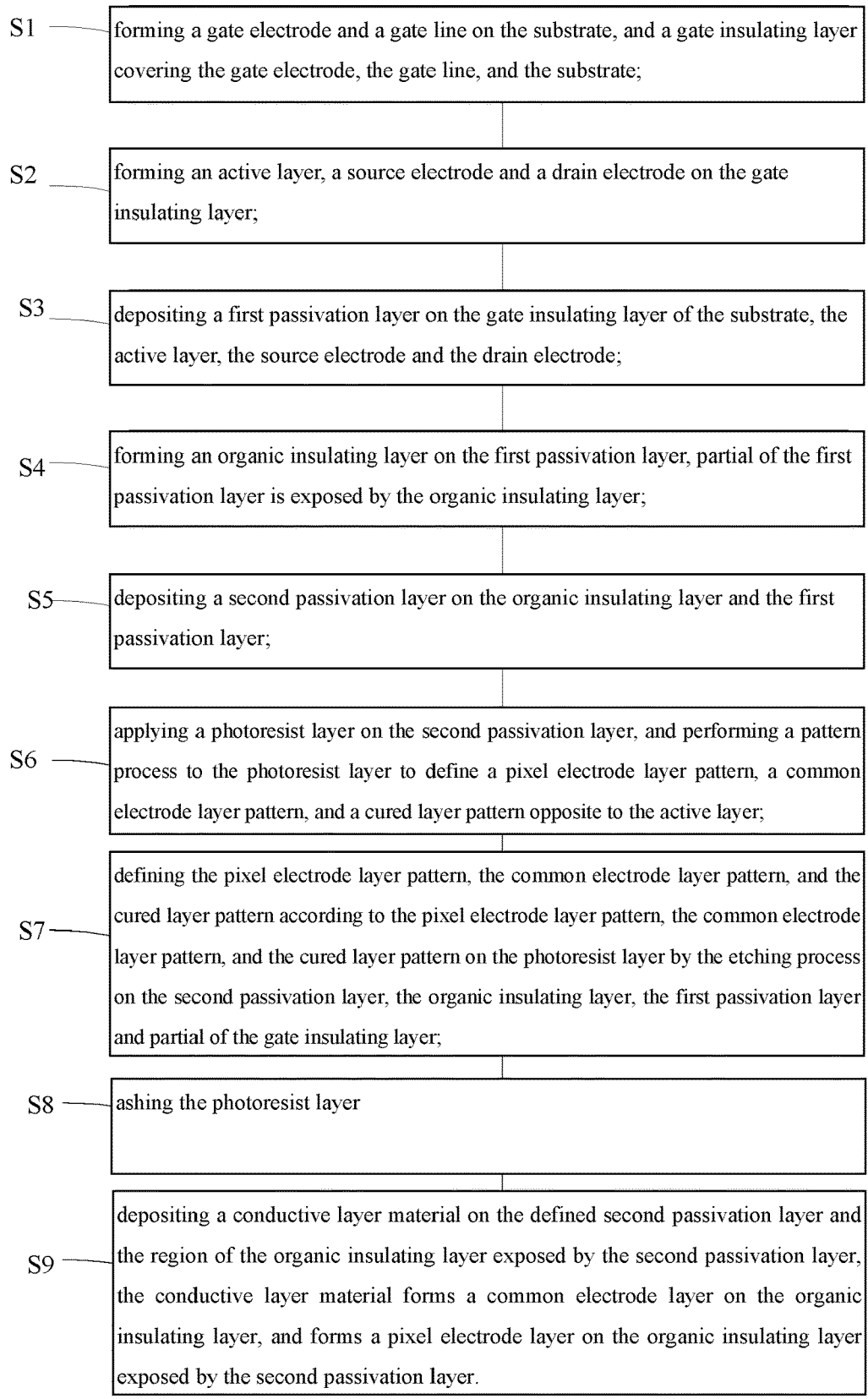
FIG. 1 is a flowchart of the method of manufacturing a thin film transistor in a preferred embodiment of the present application.

Referring to FIG. 1, is a flowchart of the method of manufacturing a thin film transistor in a preferred embodiment of the present application. The method of manufacturing the thin film transistor, TFT includes the following steps.

Step S1: forming a gate electrode and a gate line on the substrate, and a gate insulating layer covering the gate electrode, the gate line, and the substrate.

Figure 2:
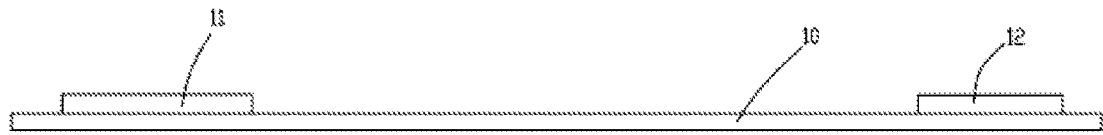
FIGS. 2 to 9 illustrate schematic diagram of the thin film transistor of the respective manufacturing processes in a preferred embodiment of the present application.

Referring to FIG. 2, specifically including, step S11, forming a first metal layer (not shown) on one surface of the substrate 10, by performing the patterning process to the first metal layer to form the patterns including the gate electrode 11 and the gate line 111; the material of the first metal layer is selected from one of copper, tungsten, chromium, aluminum and the combinations thereof. The embodiment is by the conventional technology of coating photoresist, exposure, development and other patterning process to perform the patterning process to the first metal layer and form the gate electrode 11.

Figure 3:
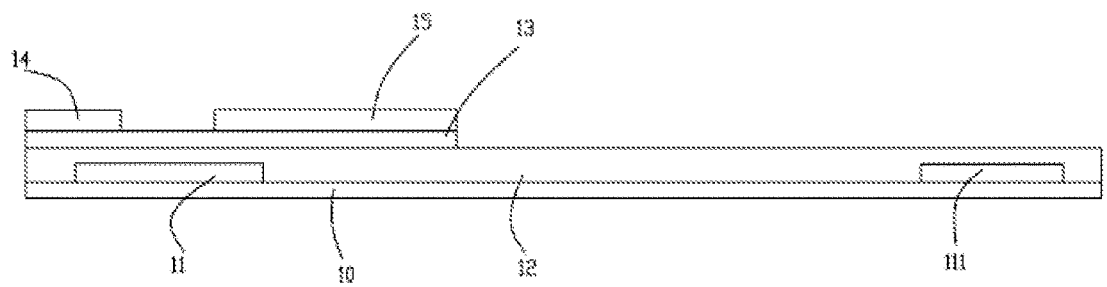

Step S12, forming the gate insulating layer 12 on the gate electrode 11, the gate line 111 and the substrate, referring to FIG. 3.

The gate insulating layer 12 covers the surface of the substrate 10 and the gate electrode 11. In particular, the gate insulating layer 12 is formed on the surface of the substrate 12 not covered by the first metal layer, and on the gate electrode11, the gate line 111. The material of the gate insulating layer 12 is selected from one of silicon oxide, silicon nitride layer, silicon oxynitride layer, and the combinations thereof.

Referring to FIG. 3, Step S2: forming an active layer 13, a source electrode 14 and a drain electrode 15 on the gate insulating layer 12. Specifically, forming an oxide semiconductor layer and a second metal layer covering the semiconductor layer on the gate insulating layer 12, by patterning process to form the active layer 13, the source electrode 14 and the drain electrode 15 by the oxide semiconductor layer, that is to say it can be formed by adaption of one photomask process in the conventional technology. Of course, it can also be divided into two photomask to form the active layer first, and a second metal layer is then formed on the active layer 13 and the exposed gate insulating layer 12, by patterning process to the second metal layer to form the source electrode 14 and the drain electrode 15 of the thin film transistor, wherein the source electrode 14 and the drain electrode 15 are connected to the active layer 13. The material of the second metal layer is selected from one of copper, tungsten, chromium, aluminum, and the combinations thereof.

Figure 4:
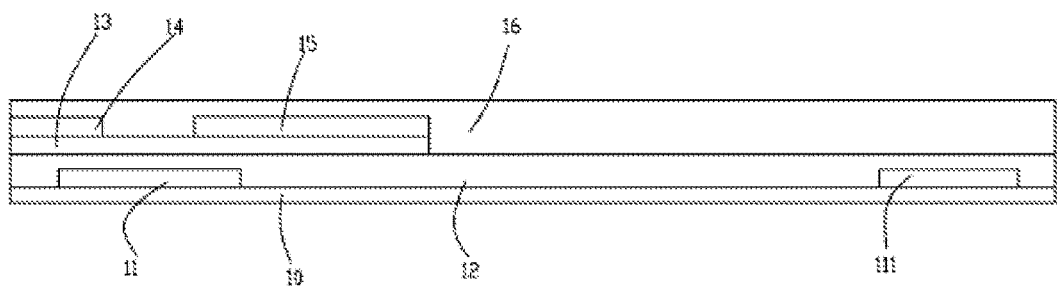

Referring to FIG. 4, step S3: depositing a first passivation layer 16 on the gate insulating layer 10 of the substrate 12, the active layer 13, the source electrode 14 and the drain electrode 15; mainly formed by the chemical vapor deposition method.

Figure 5:
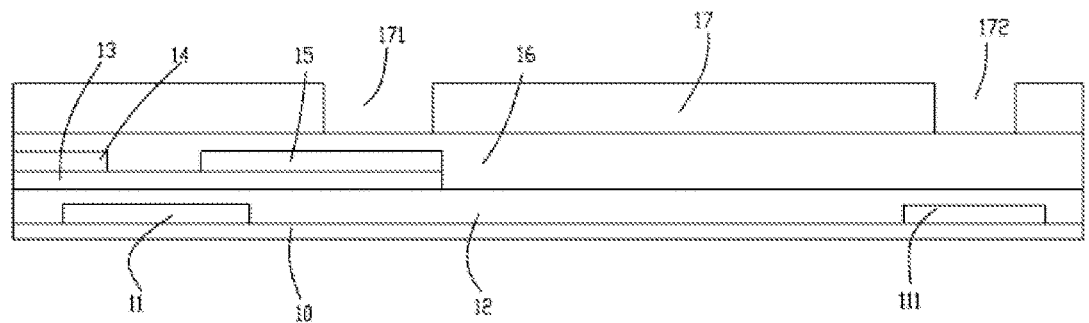

Referring to FIG. 5, step S4: forming an organic insulating layer 17 on the first passivation layer 16, partial of the first passivation layer 16 is exposed by the organic insulating layer 17; forming a first through hole 171 and a second through hole 172 on the organic insulating layer 17 mainly by patterning process, the first through hole 171 and the second through hole 172 exposed partial of the organic insulating layer 17, the first through hole 171 is for connecting to the drain electrode 15 and a pixel electrode is formed inside the first through hole 171, the first through hole 171 is with a pixel electrode, the second through hole 172 is for communication with the gate line 111.

Figure 6:
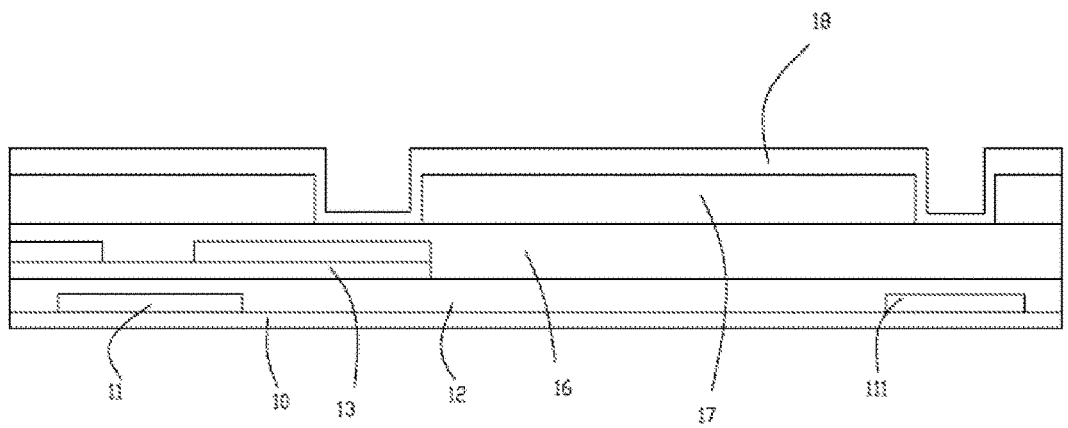

Referring to FIG. 6, step S5: depositing a second passivation layer 18 on the organic insulating layer 17 and the first passivation layer 16. The second passivation layer 18 is formed by chemical vapor deposition, with the material of SiNx or SiO, also can be other organic or inorganic materials. The second passivation layer 18 is covering the walls of the first through hole 171 and the second through hole 172.

Figure 7:
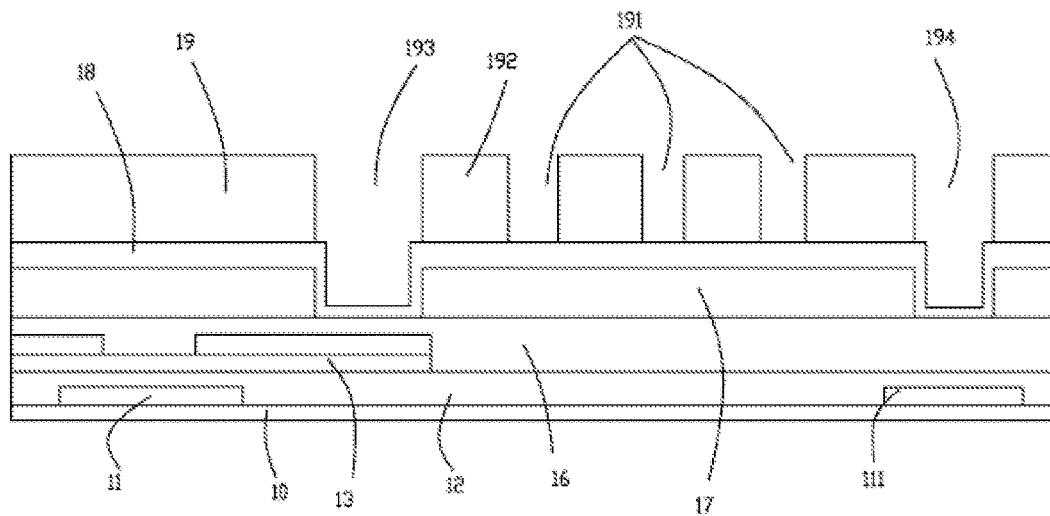

Referring to FIG. 7, step S6: applying a photoresist layer 19 on the second passivation layer 18, and performing a pattern process to the photoresist layer and defining a pixel electrode layer pattern, a common electrode layer pattern, and a cured layer pattern opposite to the active layer. Specifically, a plurality of the pattern regions disconnected by the notches is formed on the photoresist layer 19, including a plurality of first notches 191, a first pattern regions 192 spaced apart by the plurality of first notches 191, the second notch 193 communicated with the first through hole 171 and a third notch 194 communicated with the second through hole 172. A side of the second notch 193 remote from the first pattern regions 192 is a cured layer pattern 195. A side of the third notch 194 remote from the first pattern regions 192 is a first pattern regions 192.

Figure 8:
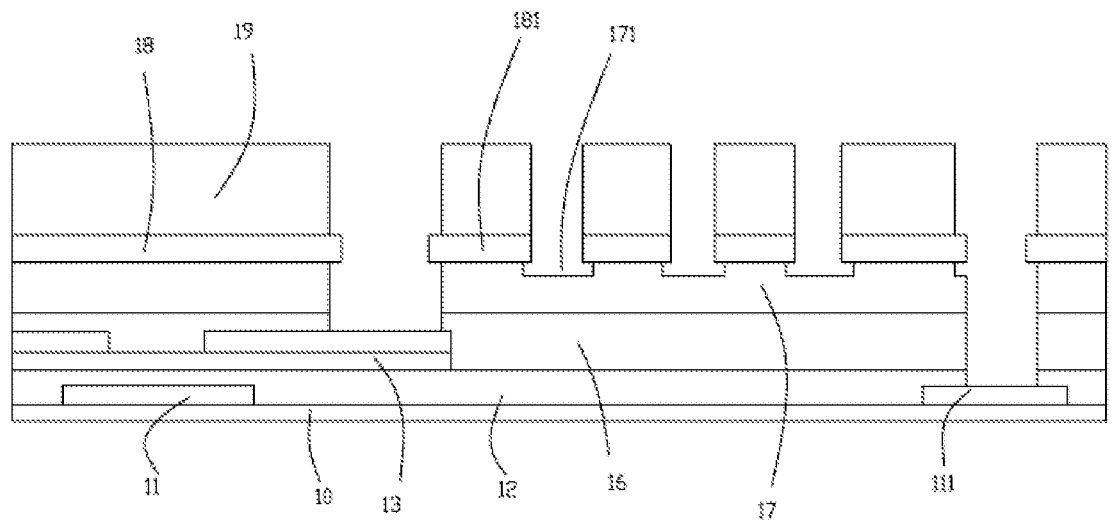

Referring to FIG. 8, step S7: defining the pixel electrode layer pattern, the common electrode layer pattern, and the cured layer pattern according to the pixel electrode layer pattern, the common electrode layer pattern, and the cured layer pattern on the photoresist layer 19 by the etching process on the second passivation layer 18, the organic insulating layer 17, the first passivation layer 16 and partial of the gate insulating layer 12. Wherein the organic insulating layer 17 has a region to expose the second passivation layer 18, the opposite sides of each pattern region of the second passivation layer 18 is projecting to the two sides of the covered organic insulating layer 17. Specifically, the region of the organic insulating layer 17 to expose the second passivation layer 18 is exposed through the first notch 191, and the first notch extends to partial of the organic insulating layer 17. The first pattern regions 192 is covering the patterned region 181 of the second passivation layer 18. The opposite sides 182 of each pattern region 181 of the second passivation layer 18 is projecting to the two sides of the covered organic insulating layer 17, that is by the first notch 191 to space apart the both sides of the organic insulating pattern 171, so when the conductive layer is deposited on the second passivation layer 18, the vertical felled conductive layer is laminated formed on each pattern region 181 of the second passivation layer 18, and the exposed region of the organic insulating layer 17 through the first notch of the second passivation layer 18, and the conductive layer is not coated on the both sides of the organic insulating pattern 171 spaced apart by the first notch 191, at the same time, since the opposite sides 182 of each pattern region 181 is projected, the conductive layer on the organic insulating layer 17 with the region to expose the second passivation layer 18 is not contacted with the two sides of the organic insulating pattern 171.

In this step, a first dry etching gas is used to the second passivation layer 18, the organic insulating layer 17, the first passivation layer 16 and partial of the gate insulating layer 12, and a second dry etching gas is added to the region of the second passivation layer 18 and the organic insulating layer 17 exposed by the first dry etching gas, that is, by the region of the organic insulating pattern 171 spaced apart by the first notch 191, makes etching amount of the both sides of the organic insulating pattern 171 is increased, so as to realize the opposite sides of each pattern region of the second passivation layer 18 is projecting to the covered both sides of the organic insulating pattern 171. In the present embodiment, the second etching gas and the first and the etching gas are the same or are oxygen. In other embodiments, the oxygen can be used to supplementary etching the both sides of the organic insulating pattern 171 of the organic insulating layer 17.

Step S8: ashing the photoresist layer 19.

Figure 9:
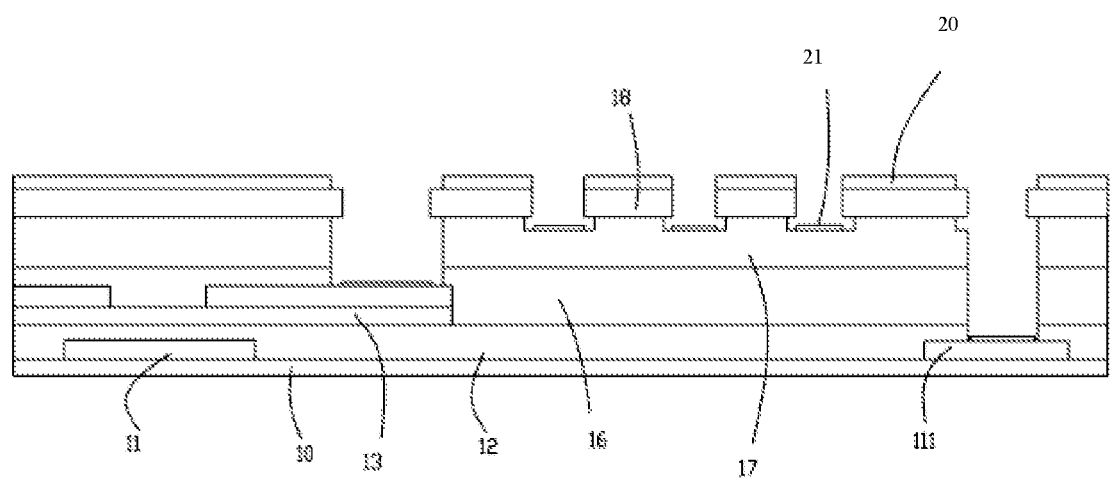

Referring to FIG. 9, Step S9: depositing a conductive layer material on the defined second passivation layer 18 and the region of the organic insulating layer 17 exposed by the second passivation layer 18, the conductive layer material forms a pixel electrode layer 20 on the second passivation layer 18, the conductive layer material exposed from the organic insulating layer 17 forms a common electrode layer 21 including an internal portion of the first through hole; Wherein, the common electrode layer 21 is disposed in the both sides of the organic insulating layer covered by the second passivation layer 18, that is a gap 172 is formed between the both sides of the organic insulating pattern 171 to prevent contact shorting of the pixel electrode and the common electrode. When depositing the conductive layer on the second passivation layer 18, the vertical falling conductive layer is laminated and formed on each pattern region 181 of the second passivation layer 18, and the exposed region of the organic insulating layer 17 through the first notch of the second passivation layer 18, and the conductive layer is not coated on the both sides of the organic insulating pattern 171 spaced apart by the first notch 191, at the same time, since the opposite sides 182 of each pattern region 181 is projected, the conductive layer on the organic insulating layer 17 with the region to expose the second passivation layer 18 is not contacted with the two sides of the organic insulating pattern 171, this process saves mask steps and simplify the process.

The pixel electrode layer and the common electrode layer by the method of manufacturing the thin film transistor of the present application are formed by deposition, the second passivation layer 18 and the organic insulating layer to form the pixel electrode layer and the common electrode layer are formed by a single etching, so that the entire manufacturing of the thin film transistor only takes four masks, the number of mask processes is decreased, and the production costs can be saved.

The present application provides a thin film transistor, the thin film transistor includes at least the substrate 10, the gate electrode 11 and the gate line 111 formed on the substrate 11, the gate insulating layer 12 covering the gate electrode 11, the gate line 111, and the substrate.

The active layer 13 formed on the gate insulating layer 12, and the source electrode 14 and the drain electrode 15 connected to the active layer 13.

The first passivation layer 16 formed on the substrate 10, the gate insulating layer 12, the active layer 13, the source electrode 14 and the drain electrode 15.

The organic insulation layer 17 and the second passivation layer 18 sequentially formed on the first passivation layer 16, the organic insulating layer 17 includes a region to exposed the by second passivation layer 18; in particular is exposed through the first through hole and the second through hole.

The pixel electrode layer 20 is formed on the second passivation layer, and the common electrode layer 21 is formed on the organic insulating layer 17 exposed by the second passivation layer.

Wherein, the opposite sides of each pattern region of the second passivation layer 18 is projecting to the two sides of the covered organic insulating layer 17. A gap is formed between each electrode of the pixel electrode layer 20 and the both sides of the organic insulating layer covered by the second passivation layer.

For the above two embodiments the present application further provides a method of manufacturing a thin film transistor, before describing the specific preparation process, it should be understood that, in the present application, the patterning process which means the patterning process can include a lithography process, or, include the lithography process and the etching step, while the process can further include printing, ink jet, etc. or other process for forming a predetermined pattern; the lithography process, is meant to include the film formation, exposure, development, and other processes to form pattern by using the photoresist, mask, exposing machine. The corresponding patterning process can select in accordance with the structure from in the present application.

The display device formed by the method for manufacturing the thin-film transistor of the embodiment of the present application can include: liquid crystal panel, liquid crystal TV, liquid crystal display, OLED panel, OLED TV, electronic paper, digital photo frames, mobile phones and so on.

Above are embodiments of the present application, which does not limit the scope of the present application. Any modifications, equivalent replacements or improvements within the spirit and principles of the embodiment described above should be covered by the protected scope of the invention.

What is claimed is:

1. A method for manufacturing a thin film transistor, comprising:

forming a gate electrode and a gate line on the substrate, and a gate insulating layer covering the gate electrode, the gate line, and the substrate;

forming an active layer, a source electrode and a drain electrode on the gate insulating layer;

depositing a first passivation layer on the gate insulating layer of the substrate, the active layer, the source electrode and the drain electrode;

forming an organic insulating layer on the first passivation layer, partial of the first passivation layer is exposed by the organic insulating layer;

depositing a second passivation layer on the organic insulating layer and the first passivation layer;

applying a photoresist layer on the second passivation layer, and performing a pattern process to the photoresist layer to define a pixel electrode layer pattern, a common electrode layer pattern, and a cured layer pattern opposite to the active layer;

defining the pixel electrode layer pattern, the common electrode layer pattern, and the cured layer pattern according to the pixel electrode layer pattern, the common electrode layer pattern, and the cured layer pattern on the photoresist layer by the etching process on the second passivation layer, the organic insulating layer, the first passivation layer and partial of the gate insulating layer, wherein the organic insulating layer has a region to expose the second passivation layer, the opposite sides of each pattern region of the second passivation layer is projecting to the two sides of the covered organic insulating layer;

ashing the photoresist layer; and depositing a conductive layer material on the defined second passivation layer and the region of the organic insulating layer exposed by the second passivation layer, the conductive layer material forms a pixel electrode layer on the second passivation layer, and forms a common electrode layer on the organic insulating layer exposed by the second passivation layer.

2. The method for manufacturing a thin film transistor according to claim 1, wherein the step of forming an organic insulating layer on the first passivation layer further comprising:

forming a first through hole and a second through hole on the organic insulating layer, the first through hole and the second through hole exposed partial of the organic insulating layer, the first through hole is for connecting to the drain electrode and the common electrode is formed inside the first through hole, the second through hole is for communication with the gate line.

3. The method for manufacturing a thin film transistor according to claim 1, wherein the step of defining the pixel electrode layer pattern, the common electrode layer pattern, and the cured layer pattern according to the pixel electrode layer pattern, the common electrode layer pattern, and the cured layer pattern on the photoresist layer by the etching process on the second passivation layer, the organic insulating layer, the first passivation layer and partial of the gate insulating layer comprising using a first dry etching gas to etch the second passivation layer, the organic insulating layer, the first passivation layer and partial of the gate insulating layer, and adding a second dry etching gas and etching the region of the organic insulating layer exposed by the second passivation layer.

4. The method for manufacturing a thin film transistor according to claim 3, wherein the second etching gas and the first and the etching gas are the same or are oxygen.

5. The method for manufacturing a thin film transistor according to claim 1, wherein the step of defining the pixel electrode layer pattern, the common electrode layer pattern, and the cured layer pattern according to the pixel electrode layer pattern, the common electrode layer pattern, and the cured layer pattern on the photoresist layer by the etching process on the second passivation layer, the organic insulating layer, the first passivation layer and partial of the gate insulating layer comprising using oxygen to supplementary etching the organic insulating layer.

6. The method for manufacturing a thin film transistor according to claim 1, wherein the first passivation layer and the second passivation layer are formed by chemical vapor deposition.

7. The method for manufacturing a thin film transistor according to claim 1, wherein a gap is formed between each electrode of the pixel electrode layer and the both sides of the organic insulating layer covered by the second passivation layer.

8. The method for manufacturing a thin film transistor according to claim 1, wherein the material of the first passivation layer and the second passivation layer are SiNx or SiO.

* * * * *